United States Patent [19]

Sakamoto et al.

[11] Patent Number: 4,789,847
[45] Date of Patent: Dec. 6, 1988

[54] FILTER CONNECTOR

[75] Inventors: Yukio Sakamoto; Takeshi Tanabe; Toshio Hori; Masashi Takeda; Mitsuhiro Iida, all of Nagaokakyo, Japan

[73] Assignee: Murata Manufacturing Co., Ltd., Japan

[21] Appl. No.: 21,155

[22] Filed: Mar. 3, 1987

[30] Foreign Application Priority Data

Mar. 5, 1986 [JP] Japan .................................. 61-49266

[51] Int. Cl.$^4$ .............................................. H03H 7/01
[52] U.S. Cl. ...................................... 333/185; 333/167; 333/184; 439/607; 439/620; 174/68.5; 361/399
[58] Field of Search ................... 333/12, 167, 181–185, 333/172; 361/331, 332, 380, 395, 397, 399, 403, 415, 417, 427; 174/68.5; 439/607, 620

[56] References Cited

U.S. PATENT DOCUMENTS

| | | | |
|---|---|---|---|
| 3,538,464 | 11/1970 | Walsh | 361/394 |
| 3,939,444 | 2/1976 | Hollydale et al. | 333/182 |
| 4,203,081 | 5/1980 | Braeckelmann | 333/185 X |
| 4,215,325 | 7/1980 | Sansone | 333/167 X |
| 4,603,320 | 7/1986 | Farago | 333/182 |
| 4,620,165 | 10/1986 | Kinzler | 333/185 X |

FOREIGN PATENT DOCUMENTS 7101617 1/1971 Fed. Rep. of Germany.

Primary Examiner—Marvin L. Nussbaum
Attorney, Agent, or Firm—Ostrolenk, Faber, Gerb & Soffen

[57] ABSTRACT

A filter connector comprises a connector body which includes a conductive shell and an insulating insert provided in the conductive shell and having a plurality of through holes. First ends of upper first terminal pins are inserted in the through holes of the insert. Second ends of the first terminal pins pass out the back of the connector body. At least one of the plurality of terminal pins is adapted to support a printed circuit board. The printed circuit board has a conductive pattern which is electrically connected with at least one of the upper first terminal pins. A second terminal pin is electrically connected to the conductive pattern, whereby the second terminal pin is electrically connected with at least one of the first terminal pins. A plurality of filter elements are inserted in a current path between at least one of the first terminal pins and the second terminal pin. At least one of the filter elements is provided on the printed circuit board, and is inserted in the current path by being electrically connected to the conductive pattern on the printed circuit board.

17 Claims, 7 Drawing Sheets

FILTER CONNECTOR

BACKGROUND OF THE INVENTION

1. Field of the Invention

The present invention relates to an improvement in structure of a filter connector, and more particularly, it relates to a filter connector having improved structure for mounting filter elements.

2. Description of the Prior Art

FIG. 1 is a sectional view showing a conventional filter connector. A shell 3 is formed by butting a front shell 1 and a back shell 2 of conductive materal. A pair of insulating inserts 4 and 5 and a conductive plate 7 provided with a feedthrough capacitor 6 are disposed in the shell 3. A connector pin 8 passes through the inserts 4 and 5 and the feedthrough capacitor 6.

The aforementioned filter connector is mounted on a bottom plate 9 such as a printed circuit board. Filter elements such as an inductance element 10a and a capacitor element 10b are mounted on the bottom plate 9, to be electrically connnected with the connector pin 8 through a conductive pattern 11.

However, the aforementioned filter connector is only provided with the capacitor 6 as a filter element. Thus, the filter characteristics are determined only by the feedthrough capacitor 6, whereby various noise components cannot be effectively removed.

Therefore, the filter elements such as the inductance element 10a and the capacitor element 10b are provided on the bottom plate 9 as hereinabove described, in order to constitute a more effective filter circuit. However, space is required on the bottom plate 9 to mount such filter elements.

Therefore, the packaging density is reduced, leading to an increase in the size of the product in which the filter connector is assembled.

SUMMARY OF THE INVENTION

Accordingly, an object of the present invention is to provide a filter connector having excellent filter characteristics, which can enable high density packaging to avoid any increase in the size of a product in which the same is assembled.

The filter connector according to the present invention comprises a conductive shell and an insulating insert provided in the conductive shell to constitute a connector body in association with the conductive shell. The insulating insert is formed with a plurality of through holes. A plurality of first terminal pins are so provided that first ends thereof are inserted in the through holes of the insulating insert and second ends are outwardly derived from the connector body. At least one of the plurality of first terminal pins is adapted to hold a printed circuit board. The printed circuit board is formed thereon with at least one conductive pattern in correspondence to at least one first terminal pin. Each conductive pattern is electrically connected with at least one first terminal pin. Further, each conductive pattern is connected with a second terminal pin, whereby the second terminal pin is electrically connected with the first terminal pin through the conductive pattern. Filter elements are inserted in a current path between at least one first terminal pin and the second terminal pin. At least one of the filter elements is provided on the aforementioned printed circuit board, to be electrically connected with the conductive pattern.

In the filter connector according to the present invention, at least one filter element is provided on the conductive pattern formed on a printed circuit board which is held by at least one first terminal pin. Thus, various filter circuits can be formed by selecting the filter elements to be provided on the printed circuit board. Therefore, an integrated type filter connector of excellent filter characteristics can be obtained. Further, the filter circuits are formed through the filter elements on the printed circuit board within the filter connector, whereby there is no need to provide filter elements in the exterior of the filter connector. Thus, high density packaging of electronic components can be enabled, to prevent increase in size of a product in which the filter connector is assembled.

These and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 1:
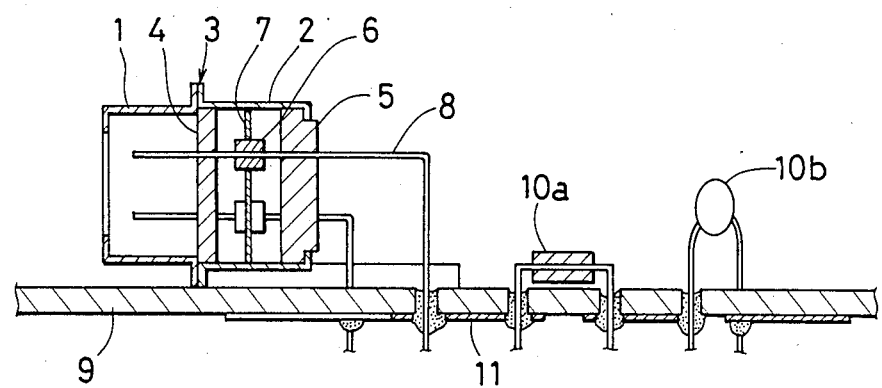
FIG. 1 is a sectional view illustrating a conventional filter connector.
Figure 2:
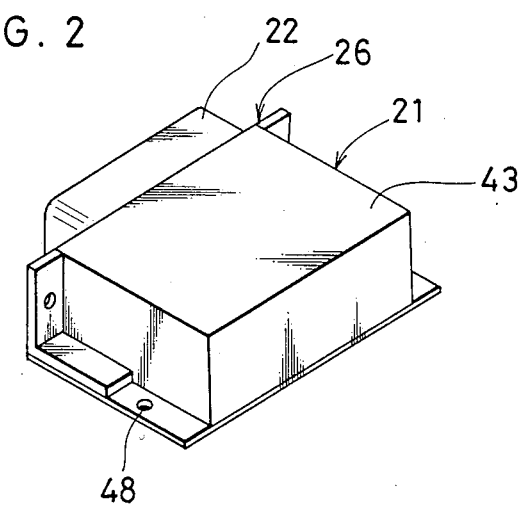
FIG. 2 is a perspective view showing a filter connector according to a first embodiment of the present invention.
Figure 3:
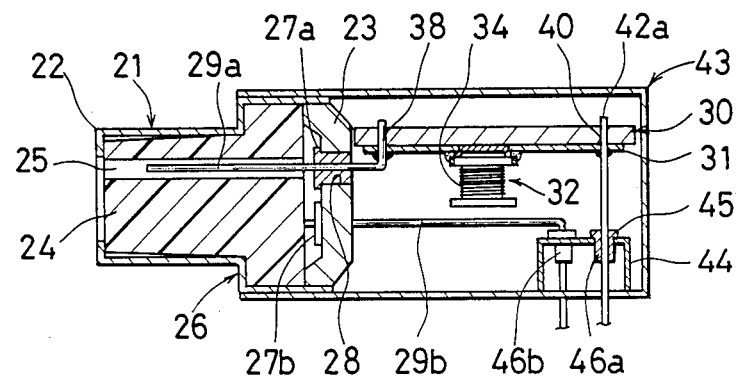
FIG. 3 is a longitudinal sectional view of the filter connector as shown in FIG. 2.

FIGS. 2 and 3 are a perspective view and a longitudinal sectional view showing a first embodiment of the present invention.

An insert 24 of insulating material such as synthetic resin is provided in a conductive shell 21. The conductive shell 21 is made of conductive material such as metal, and has a front shell 22 and a back shell 23. The insert 24 is provided with a plurality of through holes 25. The conductive shell 21 forms a connector body 26 in association with the insert 24. The back shell 23 has a hole 28, which receives a feedthrough capacitor 27a to fix the same. One electrode of the feedthrough capacitor 27a is electrically connected with the back shell 23 with solder (not shown) or the like. An end of an upper first terminal pin 29a is inserted in the through hole 25 of the insert 24 and the other electrode of the feedthrough capacitor 27a is electrically connected with the upper first terminal pin 29a. The other end of the upper first terminal pin 29a passes to the exterior of the connector body 26 from the back shell 23. The back end of the upper first terminal pin 29a is upwardly bent beyond the back shell 23.

Although not obviously shown in FIG. 3, a plurality of such upper first terminal pins 29a are provided in the direction perpendicular to the figure, and an aforementioned feedthrough capacitor 27a is provided for each of the upper first terminal pins 29a. A lower first terminal pin 29b is provided under upper first terminal pin 29a and similarly inserted in a feedthrough capacitor 27b, to be electrically connected with one electrode of the feedthrough capacitor 27b. Another electrode of the feedthrough capacitor 27b is electrically connected to the back shell 23. An end of the lower first terminal pin 29b is inserted in a through hole formed in the insert 24. The other end of the lower first terminal pin 29b is downwardly bent at its back end portion, and directly drawn into a conductive case as hereinafter described. Although not shown in FIG. 3, a plurality of such lower first terminal pins 29b are provided in the direction perpendicular to the figure.

The back end of the upper first terminal pin 29a passes beyond the connector body 26 and is upwardly bent to be inserted in a through hole 38 formed in a printed circuit board 30 and fixed to a conductive pattern 31 formed on the printed circuit board 30 by soldering. The printed circuit board 30 is fixed to the first terminal pins 29a, and is held by the same.

Figure 4:
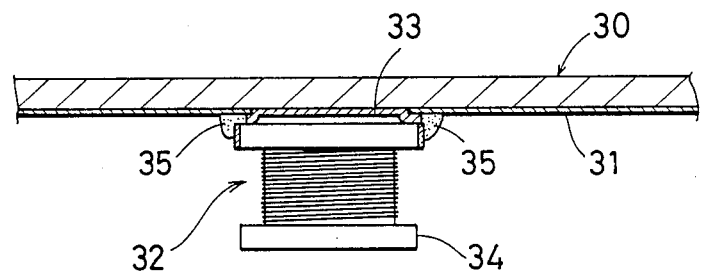
FIG. 4 is a partially enlarged sectional view showing filter elements mounted on the printed circuit board as shown in FIG. 3.
Figure 5:
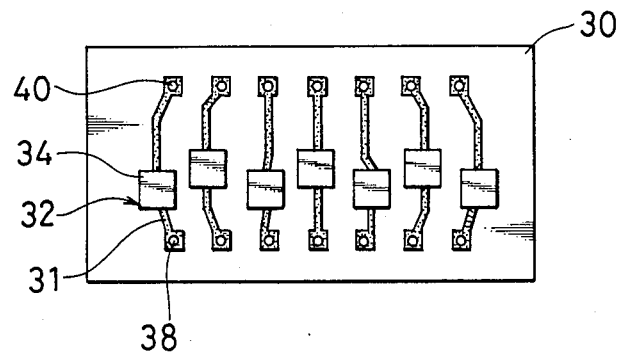
FIG. 5 is a bottom plan view of the printed circuit board as shown in FIG. 3.

As shown in the bottom plan view of FIG. 5, such conductive patterns 31 are extended to reach the other (back) edge of the printed circuit board 30 opposite to the (front) edge fixed to the terminal pins 29a. As seen in FIG. 3, filter elements 32 are mounted on the conductive patterns 31. Each of the filter elements 32 has a film-shaped resistor 33 electrically connected to the conductive pattern 31 and an inductance element 34 stacked on and fixed to the film-shaped resistor 33, as shown in an enlarged manner in FIG. 4. The inductance element 34 is electrically connected to the conductive pattern 31 by solder 35 and physically fixed to the same. As seen in FIG. 5, a plurality of such conductive patterns 31 are formed on the printed circuit board 30 in correspondence to the plurality of upper first terminal pins 29a, and the aforementioned filter elements 32 are provided on the respective conductive patterns 31. As shown in FIG. 5, adjacent ones of the inductance elements 34 are displaced to be separated from each other, in order to avoid magnetic interference between the adjacent inductance elements 34.

Referring again to FIG. 3, the printed circuit board 30 is held by the upper first terminal pins 29a, to be parallel with portions of the upper first terminal pins 29a inserted in the through holes 25. Through holes 40 are formed in the other end of the printed circuit board 30, to receive second terminal pins 42a. The second terminal pins 42a are electrically connected to the conductive patterns 31 by soldering. The second terminal pins 42a are passed out from a conductive case 43 as hereinafter described, in a direction substantially perpendicular to the first terminal pins 29a. A conductive plate 44 is fixed to the inner side of the conductive case 43 near the locations at which the second terminal pins 42a pass out from the conductive case 43. Feedthrough capacitors 46a are mounted in through holes 45 formed in the conductive plate 44, so that the second terminal pins 42a pass through the feedthrough capacitors 46a before passing out from the conductive case 43. Thus, provided between the first and second terminal pins 29a and 42a are filter circuits which include the feedthrough capacitors 27a, the filter elements 32 and the feedthrough capacitors 46a.

As to the lower first terminal pins 29b, the back ends of the portions which pass from the connector body 26 are downwardly bent as hereinabove described, so that the back ends are inserted in feedthrough capacitors 46b mounted on the conductive plate 44 similarly to the second terminal pins 42a, and then pass out from the conductive case 43. The first terminal pins 29b are electrically connected to one electrode of the feedthrough capacitors 46b, another electrode of the feedthrough capacitors 46b being connected to the conductive plate 44. Thus, with respect to the lower first terminal pins 29b, filter circuits are formed by the feed through capacitors 27b and 46b.

As seen in FIG. 3, the conductive case 43 is electrically connected to the conductive shell 21 of the connector body 26 with solder (not shown) or the like and mechanically fixed to the same, to enclose the printed circuit board 30.

Figure 6:
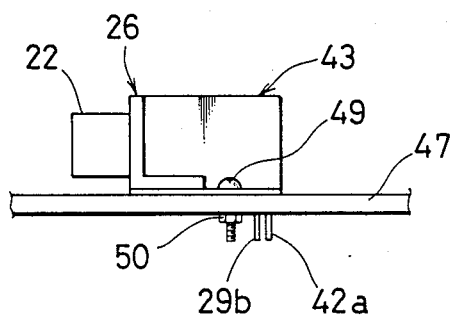
FIG. 6 is a side elevational view showing an exemplary method of mounting the filter connector according to the first embodiment on a bottom plate.

The filter connector according to the first embodiment as shown in FIG. 3 can be fixed to , e.g., a bottom plate 47 such as a printed circuit board as shown in FIG. 6, through a bolt 49 and a nut 50 inserted into a hole 48 (see FIG. 2) formed in the conductive case 43. The portions of the first and second terminal pins 29b and 42a which exit from the conductive case 43 are electrically connected to conductive patterns (not shown) formed on the bottom plate 47 by soldering or the like.

In the aforementioned filter connector, signal components flow from the upper first terminal pins 29a to the second terminal pins 42a through the conductive patterns 31. The feedthrough capacitors 27a, the filter elements 32 and the feedthrough capcitors 46a are adapted to attenuate noise components. Similarly in current paths formed through the lower first terminal pins 29b, the respective feedthrough capacitors 27b and 46b are adapted to attenuate the noise components electrically.

With reference to FIGS. 7 to 14, other embodiments of the present invention will be described. In the following description, parts identical to those in the first embodiment as shown in FIG. 3 are indicated by the same reference numerals, to omit redundant description.

Figure 7:
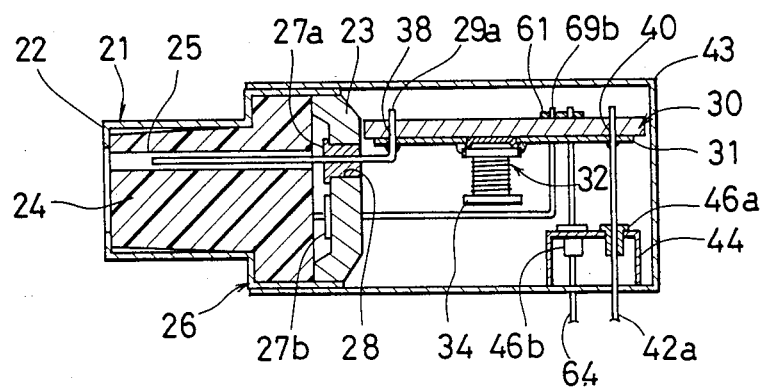
FIG. 7 is a longitudinal sectional view showing a filter connector according to a second embodiment of the present invention.
Figure 8:
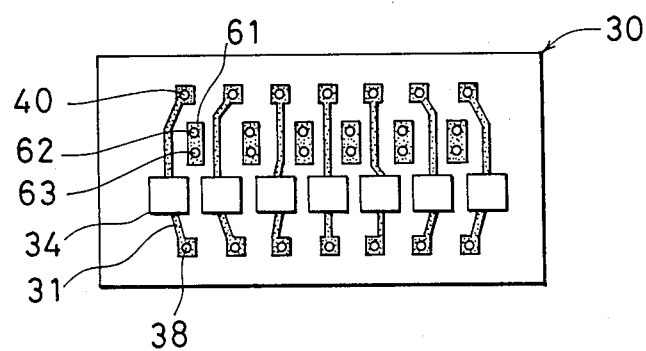
FIG. 8 is a bottom plan view of the printed circuit board as shown in FIG. 7.

FIG. 7 is a longitudinal sectional view showing a second embodiment of the present invention. There are a plurality of upper and lower first terminal pins, including upper first terminal pins 29a connected to conductive patterns 31 on a printed circuit board 30, and lower first terminal pins 69b, which are upwardly bent in their back portions behind the connector body 26, to be substantially L-shaped in configuration. In addition to the conductive patterns 31, the printed board 30 is provided thereon with connecting conductive patterns 61 as shown in the bottom plan view of FIG. 8. The connecting conductive patterns 61 are provided around through holes 62 and 63 formed in the printed circuit board 30. As shown in FIG. 7, the lower first terminal pins 69b are received in the through holes 63 and electrically connected to the connecting conductive patterns 61 by soldering or the like. As seen in FIG. 7, third terminal pins 64 are received in the through holes 62 of FIG. 8, to be electrically connected to the conductive patterns 61 by soldering or the like. The third terminal pins 64 are inserted in feedthrough capacitors 46b mounted on a conductive plate 44, and then run out from the conductive case 43. In other words in the embodiment as shown in FIG. 7, the lower first terminal pins 29b of FIG. 3 are replaced by the lower first terminal pins 69b, the connecting conductive patterns 61 and the third terminal pins 64. Other structure of this embodiment is identical to that shown in FIG. 3.

Figure 9:
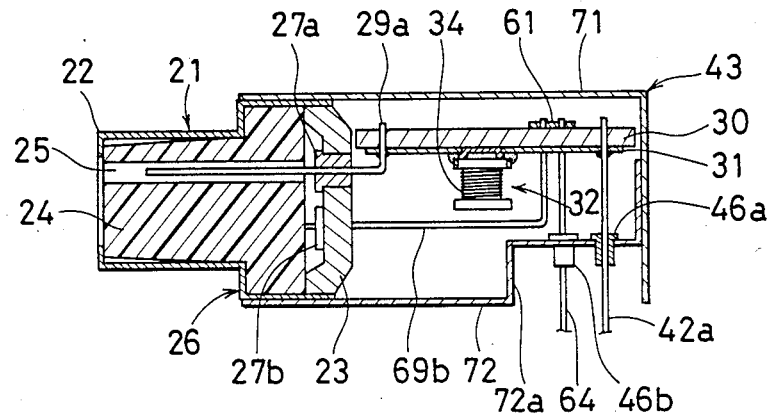
FIG. 9 is a longitudinal sectional view showing a filter connector according to a third embodiment of the present invention.

FIG. 9 is a longitudinal sectional view showing a filter connector according to a third embodiment of the present invention. A conductive case 43 of this embodiment is formed by combining an upper case 71 and a lower case 72, and the lower case 72 has formed with a step 72a which forms a portion of the lower case 72 that is closer to a printed circuit board 30 than the rest of the lower case 72. Feedthrough capacitors 46a and 46b are mounted on the part of the lower case 72 to the printed circuit board 30. Other elements of this embodiment are absolutely identical to those shown in FIG. 7, and indicated by the same reference numerals to omit redundant description.

Figure 10:
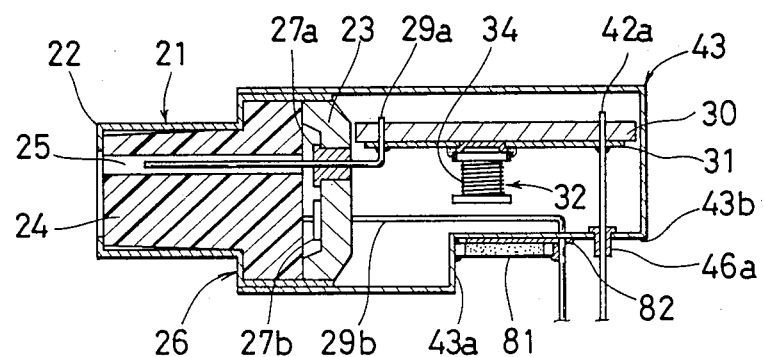
FIG. 10 is a longitudinal sectional view showing a filter connector according to a fourth embodiment of the present invention.

FIG. 10 is a longitudinal sectional view showing a fourth embodiment of the present invention. A conductive case 43 is provided with a step 43a in its bottom portion, so that feedthrough capacitors 46a are fixed to a portion 43b closer to a printed circuit board 30. Thus, this embodiment is different from that shown in FIG. 3 in that no conductive plate 44 is mounted. Further, the back ends of lower first terminal pins 29b not holding the printed circuit board 30 are downwardly bent and then run out from the conductive case 43. Chip-like monolithic capacitors 81 are electrically connected between the lower first terminal pins 29b and the conductive case 43, at portions of the lower first terminal pins 29b outside of the conductive case 43. The monolithic capacitors 81 are separated from the portion 43b of the conductive case 43 closer to the printed circuit board 30 by an insulating sheet 82, and fixed to the lower first terminal pins 29b and the step 43a of the conductive case 43 by soldering. Thus, since the feedthrough capacitors 46b of FIG. 3 are replaced by the monolithic capacitors 81, capacitance can be increased, so that noise components are effectively removed in the portions of the lower first terminal pins 29b outside the conductive case 43.

Figure 11:
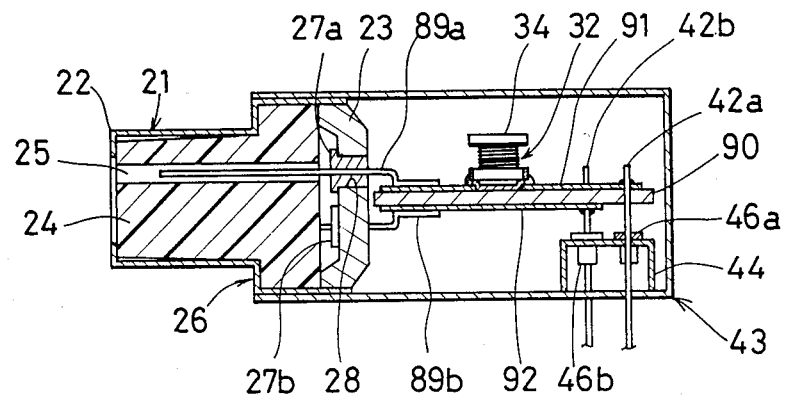
FIG. 11 is a longitudinal sectional view showing a filter connector according to a fifth embodiment of the present invention.

FIG. 11 is a longitudinal sectional view showing a fifth embodiment of the present invention, which is a modification of that shown in FIG. 7. The back ends of upper and lower first terminal pins 89a and 89b beyond the connector body 26 are bent in L-shaped configurations to hold a printed circuit board 90. Namely, the back end portions of the upper and lower first terminal pins 89a and 89b are extended in parallel with each other at a distance substantially identical to the thickness of the printed circuit board 90. The printed circuit board 90 is inserted between the terminal pins 89a and 89b, which are electrically connected with conductive patterns 91 and 92 on the printed circuit board 90 respectively. Thus, according to this embodiment, the printed circuit board 90 is held by both of the upper and lower first terminal pins 89a and 89b. The distance between the back end portions of the terminal pins 89a and 89b is preferably slightly shorter than the thickness of the printed circuit board 90, so that the printed circuit board 90 can be held between the terminal pins 89a and 89b in a pressure contact manner.

Conductive patterns 91 and 92 are formed on both surfaces, i.e., on both of the upper and lower surfaces of the printed circuit board 90. Filter elements 32 are electrically connected with the upper conductive patterns 91. The filter elements 32 are similar to those shown in FIG. 4, except that the same are mounted on the upper surface of the printed circuit board 90. On the other hand, the conductive patterns 92 are adapted to electrically connect the lower first terminal pins 89b with third terminal pins 42b.

As seen in FIG. 11, the filter elements 32 may be provided on the upper surface of the printed circuit board 90. Thus, it is understood that the filter elements 32 may be provided on the upper surfaces of the printed circuit boards 30 also in the embodiments as shown in FIGS. 3 to 10.

Figure 12:
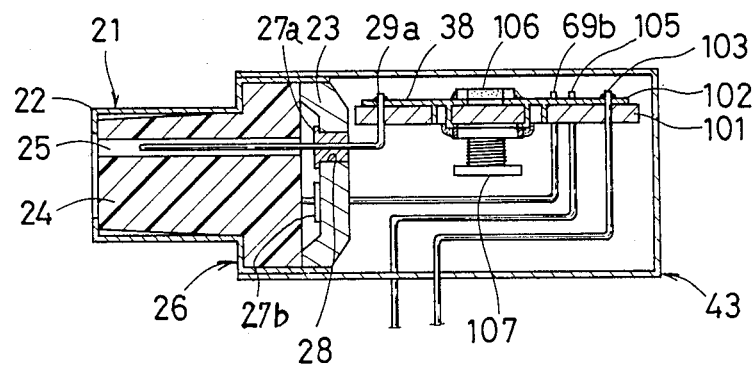
FIG. 12 is a longitudinal sectional view showing a filter connector according to a sixth embodiment of the present invention.

FIG. 12 is a longitudinal sectional view showing a sixth embodiment of the present invention. Conductive patterns 102 are formed on the upper surface of a printed board 101. Upper first terminal pins 29a are electrically connected to the conductive patterns 102, while second terminal pins 103 are electrically connected to the other back ends of the conductive patterns 102. As seen in FIG. 12, the second terminal pins 103 are largely bent forward toward the connector body 26, and then run out from the conductive case 43 in the vicinity of the connector body 26.

Figure 13:
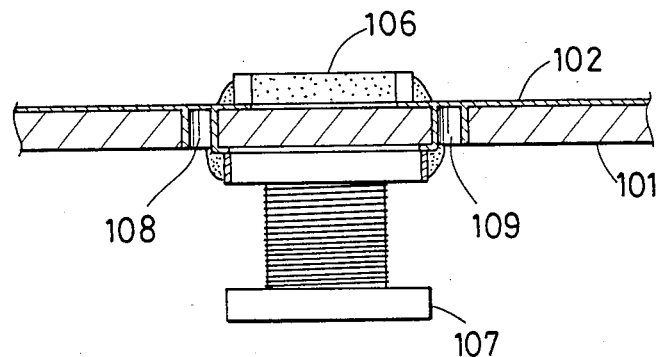
FIG. 13 is a partially enlarged sectional view showing filter elements mounted on the printed circuit board as shown in FIG. 12.

On the other hand, lower first terminal pins 69b are electrically connected to connecting conductive patterns (not shown) on the printed circuit board 101 similarly to the embodiment of FIG. 7, and third terminal pins 105 are also electrically connected to the connecting conductive patterns. The third terminal pins 105 are bent in an L-shaped configuration similarly to the second terminal pins 103, and pass out from the conductive case 43 at positions closer to the connector body 26. Filter elements formed on the conductive patterns 102 include chip-like resistors 106 and chip-like inductance elements 107, as shown in FIG. 13 in an enlarged manner. The resistors 106 are mounted on the upper surface of the printed circuit board 101, while the inductance elements 107 are mounted on the lower surface thereof. The inductance elements 107 are electrically connected to the conductive patterns 102 on the printed circuit board 101 by through holes 108 and 109 coated with conductive paste on inner peripheral surfaces thereof.

Figure 14:
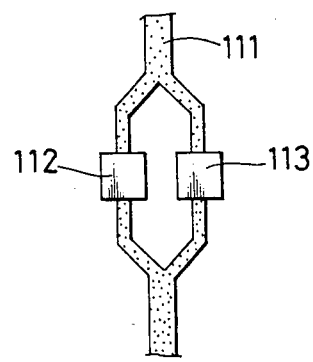
FIG. 14 is a schematic plan view illustrating another example of the conductive pattern.

As shown in FIG. 12, the "filter elements" employed in the present invention are not restricted to the aforementioned film-shaped resistors, but may be formed by chip-like resistors. Arbitrary filter elements may be combined to be mounted in arbitrary positions on either the upper or lower surface of a printed circuit board, to form filter circuits of desired characteristics. For example, a conductive pattern 111 formed on a printed circuit board may be partially branched to connect filter elements 112 and 113 in parallel, as shown in FIG. 14.

Further, although the feedthrough capacitors 27a and 27b are placed in the connector body 26, such feedthrough capacitors 27a and 27b may be omitted.

Although the present invention has been described and illustrated in detail in connection with embodiments thereof, it is clearly understood that the same is by way of illustration and example only and is not to be taken by way of limitation, the scope of the present invention being limited only by the terms of the appended claims.

What is claimed is:

1. A filter connector comprising:
    a conductive shell defining opposite front and rear directions, and defining opposite upper and lower directions;
    an insulating insert provided in a front portion of said conductive shell and having a plurality of through holes, said insulating insert forming a connector body in association with said conductive shell;
    a plurality of first terminal pins having first ends inserted in through holes of said insert at least in an upper portion of said insert, and second ends which pass rearwardly from said connector body;
    a printed circuit board supported by at least one of said first terminal pins;
    at least one conductive pattern formed on said printed circuit board and electrically connected with said at least one of said first terminal pins which supports said printed circuit board;
    at least one second terminal pin connected to a rearward portion of said conductive pattern on said printed circuit board and thereby electrically connected with said at least one first terminal pin through said conductive pattern; said printed circuit board being completely supported by at least one of said first and second terminal pins and out of contact with said connector body;
    filter means inserted in a current path between said at least one first terminal pin and said at least one second terminal pin, said filter means being provided on said printed circuit board and inserted into said current path by being electrically connected to said conductive pattern; and
    further comprising a conductive case enclosing said printed circuit board but out of contact with said printed circuit board, said conductive case being electrically connected to said conductive shell of said connector body.

2. A filter connector in accordance with claim 1, wherein said printed circuit board is supported in parallel with said first ends of said plurality of first terminal pins inserted in the through holes.

3. A filter connector in accordance with claim 1, wherein said second terminal pin is substantially perpendicular to said first ends of said first terminal pins received in said through holes.

4. A filter connector in accordance with claim 3, further comprising a plurality of lower first terminal pins not electrically connected to said conductive pattern on said printed circuit board, rear end portions of said lower first terminal pins being bent in parallel with said second terminal pin connected to said printed circuit board and then running out of said conductive case in parallel with said second terminal pin.

5. A filter connector in accordance with claim 4, wherein a capacitor is connected between said conductive case and a portion of at least one of said pins running out of said conductive case; namely, said lower first terminal pins not electrically connected to said conductive patterns and said second terminal pin, near a location where it runs out of said conductive case.

6. A filter connector in accordance with claim 5, wherein said capacitor is a monolithic capacitor.

7. A filter connector in accordance with claim 5, wherein said capacitor is a feedthrough capacitor.

8. A filter connector in accordance with claim 5, wherein a connecting conductive pattern is formed on said printed circuit board separately from said conductive pattern,
    said plurality of first terminal pins include at least one first terminal pin electrically connected to said conductive pattern, and at least one lower first terminal pin electrically connected to said connecting conductive pattern,
    said filter connector further comprising third terminal pins electrically connected to said connecting conductive pattern and extended in parallel with said second terminal pin.

9. A filter connector in accordance with claim 8, wherein a capacitor is connected between at least one of said second and third terminal pins and said conductive case.

10. A filter connector in accordance with claim 9, wherein said capacitor is a laminated capacitor.

11. A filter connector in accordance with claim 9, wherein said capacitor is a feedthrough capacitor.

12. A filter connector in accordance with claim 1, wherein said filter means provided on said printed circuit board include a resistor element and an inductance element mounted on said printed circuit board.

13. A filter connector in accordance with claim 1, wherein said conductive patterns are formed on both surfaces of said printed circuit board.

14. A filter connector in accordance with claim 13, wherein said filter means provided on said printed circuit board are mounted on said both surfaces of said printed circuit board.

15. A filter connector in accordance with claim 1, wherein a plurality of said first terminal pins are provided for supporting said printed circuit board and said filter means includes a plurality of filter elements provided on said printed circuit board in correspondence to respective ones of said first terminal pins, respective said filter elements including inductance elements.

16. A filter connector in accodance with claim 15, wherein said inductance elements are alternately displaced from each other so that adjacent ones of said inductance elements are separated from each other.

17. A filter connector comprising:
    a conductive shell defining opposite front and rear directions, and defining opposite upper and lower directions;
    an insulating insert provided in a front portion of said conductive shell and having a plurality of through holes, said insulating insert forming a connector body in association with said conductive shell;
    a plurality of first terminal pins having first ends inserted in through holes of said insert at least in an upper portion of said insert, and second ends which pass rearwardly from said connector body;
    a printed circuit board supported by at least one of said first terminal pins;
    at least one conductive pattern formed on said printed circuit board and electrically connected with said at least one of said first terminal pins;
    at least one second terminal pin connected to a rearward portion of said conductive pattern on said printed circuit board and thereby electrically connected with said at least one first terminal pin through said conductive pattern;

filter means inserted in a current path between said at least one first terminal pin and said at least one second terminal pin, said filter means being provided on said printed circuit board and inserted into said curent path by being electrically connected to said conductive pattern; and said filter means provided on said printed circuit board include a resistor element and an inductance element mounted on said printed circuit board; wherein said resistor element is formed by a film-shaped resistor provided on said printed circuit board, and said inductance element is stacked on said film-shaped resistor and fixed to the same.

* * * * *